US010598152B2

(12) United States Patent
Peter

(10) Patent No.: US 10,598,152 B2
(45) Date of Patent: Mar. 24, 2020

(54) MULTI-POWER SOURCE WIND TURBINES

(71) Applicant: Geoffrey Peter, Newport, OR (US)

(72) Inventor: Geoffrey Peter, Newport, OR (US)

( * ) Notice: Subject to any disclaimer, the term of this patent is extended or adjusted under 35 U.S.C. 154(b) by 0 days.

(21) Appl. No.: 16/104,789

(22) Filed: Aug. 17, 2018

(65) Prior Publication Data

US 2019/0093633 A1 Mar. 28, 2019

Related U.S. Application Data

(60) Provisional application No. 62/564,722, filed on Sep. 28, 2017.

(51) Int. Cl.
| | |
|---|---|
| *F03D 9/00* | (2016.01) |
| *F03D 1/06* | (2006.01) |
| *F03D 9/25* | (2016.01) |
| *H02K 7/18* | (2006.01) |
| *H02S 10/12* | (2014.01) |
| *H02K 13/00* | (2006.01) |
| *H01R 39/08* | (2006.01) |
| *H02S 40/34* | (2014.01) |
| *H01L 31/042* | (2014.01) |

(52) U.S. Cl.
CPC ........... *F03D 9/007* (2013.01); *F03D 1/0666* (2013.01); *F03D 1/0675* (2013.01); *F03D 9/25* (2016.05); *H01L 31/042* (2013.01); *H01R 39/08* (2013.01); *H02K 7/183* (2013.01); *H02K 7/1838* (2013.01); *H02K 13/003* (2013.01); *H02S 10/12* (2014.12); *H02S 40/34* (2014.12); *F05B 2220/706* (2013.01); *F05B 2220/708* (2013.01); *F05B 2240/221* (2013.01)

(58) Field of Classification Search
USPC .................................................. 290/44, 55
See application file for complete search history.

(56) References Cited

U.S. PATENT DOCUMENTS

| | | | | |
|---|---|---|---|---|
| 1,352,960 | A | * | 9/1920 | Heyroth ............... H02K 7/1869 290/44 |
| 2,023,626 | A | * | 12/1935 | Turtle ....................... B60L 1/00 307/112 |
| 2,093,950 | A | * | 9/1937 | Berger .................... H02K 31/02 310/178 |

(Continued)

FOREIGN PATENT DOCUMENTS

KR 10-1472383 B1 12/2012

*Primary Examiner* — Pedro J Cuevas
(74) *Attorney, Agent, or Firm* — Miller IP Law, LLC

(57) ABSTRACT

A method, system, apparatus, and/or device for generating electrical power from a solar cell and rotational energy from a blade of a wind turbine. The method, system, apparatus, and/or device a blade of a wind turbine, a solar cell, and a rotor system. The blade may be blade configured to catch wind from a surrounding area to rotate the blade and convert kinetic energy into rotational energy. The solar cell may be connected to an exterior surface of the blade. The solar cell may be configured to convert solar energy into electric energy. The rotor system may be electrically connected to the solar cell to receive the electric energy from the solar cell. The rotor system may be configured to remain stationary relative to the blade as the blade rotates about an axis. The rotor system is configured to send the electric energy to a power source.

20 Claims, 6 Drawing Sheets

(56) References Cited

U.S. PATENT DOCUMENTS

| | | | | |
|---|---|---|---|---|
| 2,696,585 A * | 12/1954 | Vermillion | ............ | H02K 16/025 322/47 |
| 2,923,861 A * | 2/1960 | Colt | ............ | G01P 5/07 361/170 |
| 2,931,927 A * | 4/1960 | McAdam | ............ | F04C 18/10 310/67 R |
| 2,939,975 A * | 6/1960 | Richards | ............ | H02K 19/34 310/131 |
| 2,978,600 A * | 4/1961 | Silverman | ............ | H02K 13/00 310/232 |
| 3,017,562 A * | 1/1962 | Duane | ............ | H02K 19/30 322/46 |
| 3,073,979 A * | 1/1963 | Potter | ............ | H01R 39/08 310/231 |
| 3,151,261 A * | 9/1964 | Lee | ............ | H02K 99/00 310/198 |
| 3,184,625 A * | 5/1965 | Farison | ............ | H02K 1/243 310/59 |
| 3,230,404 A * | 1/1966 | Graham | ............ | H02K 1/243 310/51 |
| 4,277,708 A * | 7/1981 | McNab | ............ | H01R 39/46 310/228 |
| 4,398,113 A * | 8/1983 | Lewis | ............ | H01R 39/18 310/232 |
| 5,075,564 A * | 12/1991 | Hickey | ............ | B63H 9/06 290/55 |
| 5,254,876 A | 10/1993 | Hickey | | |
| 6,285,006 B1 * | 9/2001 | Hyllberg | ............ | G03G 15/2053 219/216 |
| 7,045,702 B2 * | 5/2006 | Kashyap | ............ | F03D 9/007 136/244 |
| 7,105,983 B2 * | 9/2006 | Day | ............ | H01R 39/24 310/238 |
| 7,453,167 B2 * | 11/2008 | Gilbert | ............ | F03D 3/005 290/55 |
| 7,545,073 B2 * | 6/2009 | Lewis | ............ | H01R 39/24 310/232 |
| 8,189,317 B2 * | 5/2012 | Oh | ............ | H02K 11/40 310/309 |
| 8,354,757 B2 * | 1/2013 | Lee | ............ | F03D 9/00 290/44 |
| 8,482,247 B2 * | 7/2013 | Lechte | ............ | F03D 80/00 320/101 |
| 8,847,425 B2 * | 9/2014 | Jordan, Sr. | ............ | F03D 9/007 290/55 |
| 2003/0230333 A1 | 12/2003 | Kashyap | | |
| 2004/0041409 A1 | 3/2004 | Gabrys | | |
| 2010/0129216 A1 | 5/2010 | Bagepalli | | |
| 2010/0320760 A1 | 12/2010 | Yu et al. | | |
| 2011/0133683 A1 * | 6/2011 | Lechte | ............ | F03D 80/00 320/101 |
| 2017/0152837 A1 * | 6/2017 | Anemaat | ............ | F03D 9/007 |

* cited by examiner

MULTI-POWER SOURCE WIND TURBINES

CROSS-REFERENCE TO RELATED APPLICATION

This application claims the benefit of U.S. Provisional Application No. 62/564,722, filed Sep. 28, 2017.

BACKGROUND

A wind turbine is a structure that generates electrical power from wind energy. The wind turbine includes blades that catch wind as it blows to rotate a rotor and generate energy that is converted from rotational energy to electric energy by a generator. The blades catch the wind and drive the rotor thereby converting energy in the wind into rotational energy. A generator is connected to the turbine rotor to convert the rotational energy into electric energy. The amount of wind blowing in the area surrounding approximate the wind turbine determines the amount of energy generated by the wind turbine.

BRIEF DESCRIPTION OF THE DRAWINGS

The present description will be understood more fully from the detailed description given below and from the accompanying drawings of various embodiments of the present embodiment, which is not to be taken to limit the present embodiment to the specific embodiments but are for explanation and understanding.

DETAILED DESCRIPTION

Figure 1A:
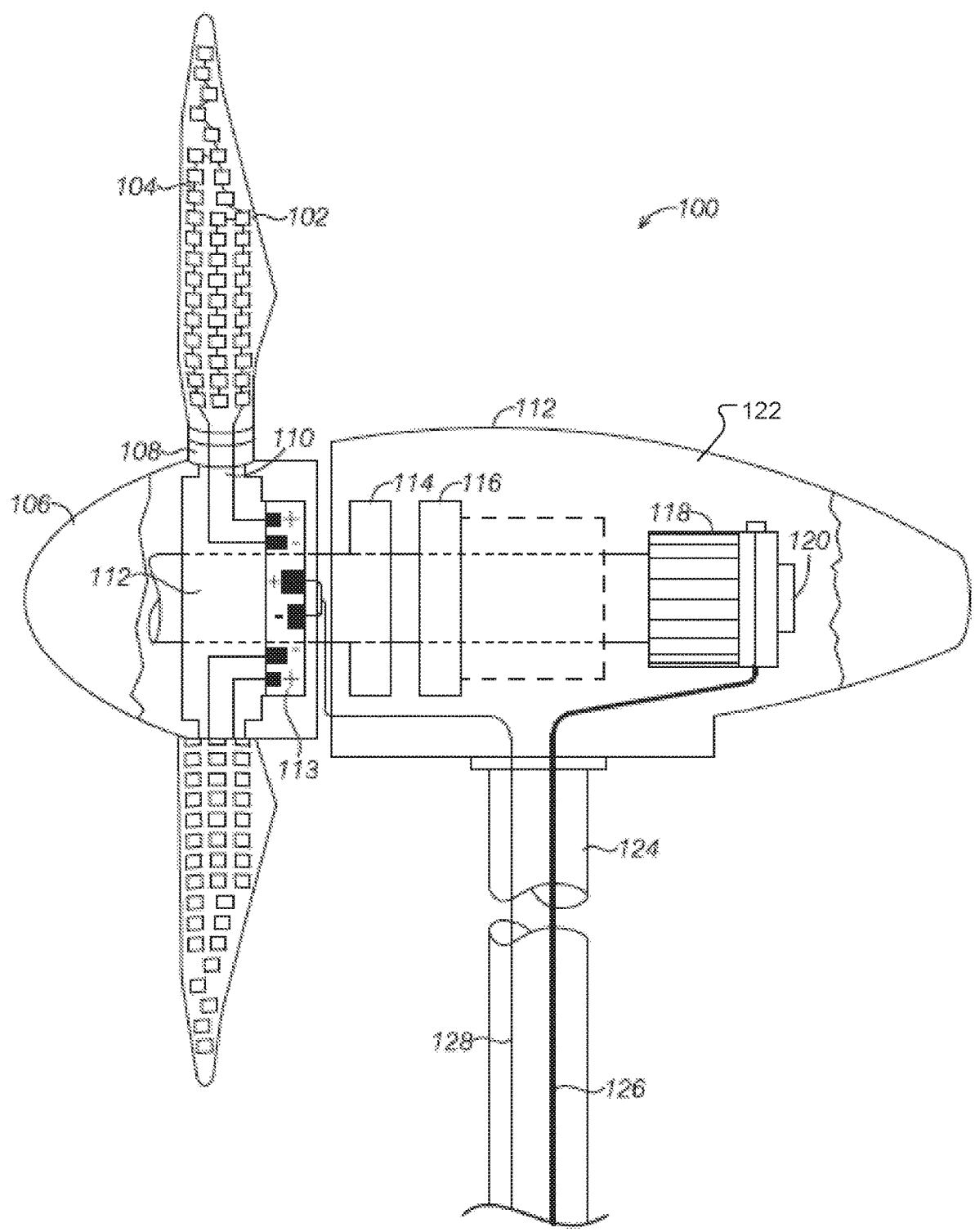
FIG. 1A illustrates a side exposed view of a wind turbine with blades that include solar cells, according to an embodiment.

The disclosed multi-power source wind turbines will become better understood through review of the following detailed description in conjunction with the figures. The detailed description and figures provide merely examples of the various inventions described herein. Those skilled in the art will understand that the disclosed examples may be varied, modified, and altered without departing from the scope of the inventions described herein. Many variations are contemplated for different applications and design considerations; however, for the sake of brevity, each and every contemplated variation is not individually described in the following detailed description.

Throughout the following detailed description, a variety of multi-power source wind turbine examples are provided. Related features in the examples may be identical, similar, or dissimilar in different examples. For the sake of brevity, related features will not be redundantly explained in each example. Instead, the use of related feature names will cue the reader that the feature with a related feature name may be similar to the related feature in an example explained previously. Features specific to a given example will be described in that particular example. The reader should understand that a given feature need not be the same or similar to the specific portrayal of a related feature in any given figure or example.

A wind turbine is an apparatus that converts kinetic energy from the wind into electricity. Conventional wind turbines include one or more blades attached to a rotor. The blades are configured to catch the wind as the wind blows and turn the rotor. Conventionally, the blades of a wind turbine turn between 13 and 20 revolutions per minute (RPM), where the RMP of the rotor varies in relation to the velocity of the wind. As the wind blows at a greater velocity, the blades catch an increased amount of wind and rotate at an increased RPM. As the blades rotate at the increased RPM, the rotor spins at a great speed, converting an increased amount of kinetic energy to rotational energy. Conventionally, the rotor is connected to a generator that the converts the rotational energy into electric energy that may be supplied into a power grid or stored at a power storage device. With an increasing demand for power to support the growing consumption of power by individuals and businesses, wind turbines may be a desired source of power. However, conventional the wind turbines are dependent on the amount of wind blowing in an area surrounding the wind turbine. When there is little to no wind in the surrounding area, the wind turbines do not generate power and may be rendered relatively useless during the periods. While conventional wind turbines may include mechanisms to increase the RPMs generated in low wind conditions and/or include generators adapted for the low speed, the conventional wind turbines still require a threshold amount of wind in order to generate electric energy. For example, the downtime of a conventional wind turbine due to low wind conditions and no wind conditions is approximately 30 percent of the potential operational time of the wind turbine.

Implementations of the disclosure address the above-mentioned deficiencies and other deficiencies by providing a method, system, device, and/or apparatus to generate electric energy when the velocity of the wind is insufficient and/or generate energy in addition to the energy generated from the kinetic energy of the wind. The method, system, device, or apparatus may utilize solar cells mounted to the wind turbine to generate solar power. In one example, the solar cells may be mounted to the blades, exterior body of the wind turbine, and/or other surfaces of the wind turbine exposed to the sun. One advantage of the solar cells being integrated into the wind turbine may be to generate solar power during down times of the wind turbine. Another advantage of the solar cells being integrated into the wind turbine may be to generate additional electricity when the wind turbine is active.

FIG. 1 illustrates a side exposed view of a wind turbine 100 with blades 102 that include solar cells 104, according to an embodiment. The wind turbine 100 may be configured to convert kinetic energy from wind power from the sun into electrical power. The wind turbine 100 may include one or more blades 102 and a first shaft 112. The blades 102 may be connected to the first shaft 112. The blades 102 may lift and rotate when the wind is blown over them, causing the first shaft 112 to spin. In one embodiment, the wind turbine 100 may include a single blade 102. In another embodiment, the wind turbine 100 may include multiple blades 102, such as two blades 102 or three blades 102. The wind turbine 100 may also include a spinner 106 that may attach to a front or nose of the wind turbine to protect the interior parts of the wind turbine and also force additional wind toward the blades 102. The spinner 106 may be part of a housing of the wind turbine 100 that includes a cavity that stores a portion of a hub 108, at least a portion of a first shaft 112, and rotor system 113.

In another embodiment, the blades 102 may include solar cells 104 integrated into a surface of the blades 102. In one embodiment, the solar cells 104 may be attached to the exterior surface of the blades 102. In one example, the solar cells 104 may be a film that may adhere to an exterior surface of the blades 102. In another example, the solar cells 104 may be a substrate, such as a tile or a wafer, that may be fastened to the exterior surface of the blades 102. The film and/or the substrate may be attached to the blades 102 by an adhesive, a bolt, hooks, fasteners, and so forth.

In another embodiment, the solar cells 104 may be integrated into the surface of the blades 102. In one example, the exterior surface of the blades 102 may be a material used to absorb solar energy. In another example, one or more material used for solar cells 104 may be applied directly to the exterior surface of the blades 102. In one embodiment, once the solar cell material is applied to the surface of the blades 102, a protective material may be applied over the solar cell material to protect the solar cell material from damage, such as wind damage, dust damage, water damage, impact damage, and so forth.

The solar cell material may include silicon material, plexiglass material, cadmium telluride material, concentrator photovoltaics (PC) material, copper indium gallium selenide material, crystalline silicon material, gallium arsenide germanium material, luminescent material, monocrystalline material, organic material, nanocrystal material, perovskite material, photoelectrochemical material, plasmonic material, polycrystalline material, quantum dot material, solid-state material, film material, water-based crystalline material, and so forth. The protective material may include a glass material, a plexiglass material, a plastic material, a resin material, a fiberglass material, a sapphire material, a ceramic material, or other types of transparent material or translucent material that allow solar energy to pass through the protective material to reach the solar cell material.

The blades 102 may collect multiple types of energy to convert to electric energy. For example, as wind rotates the blades 102, the blades 102 may collect kinetic energy from the wind that is converted to electric energy, as discussed below. In another example, the solar cells 104 of the blades 102 may collect solar energy from the sun that is also converted into electric energy, as discussed below.

The blades 102 may be connected to the first shaft 112 by a hub 108. The hub 108 connects the blades 102 to the first shaft 112 and a drive train of the wind turbine 100. The hub 108 may rotate on or with an axle from which the blades 102 radiate. As the blades 102 catch the wind, the blades 102 may rotate, which in turn rotate the hub 108 and the first shaft 112.

One or more rotor systems 113 may be attached the hub 108. In one embodiment, the rotor system 113 may include rings connected to a body or housing of the wind turbine 100 and may remain fixed and stationary as the first shaft 112 rotates. The rotor system 113 may remain stationary as the solar cells 104 pass an electric current to the slip rings via the wires 110 pressing against the rotor system 113. In one example, the wires 110 may include brushes or contacts, such as stationary graphite or metal contacts, that contact or rub on the outside diameter of a ring of the rotor system 113. In one example, to connect the solar cells 104 of the blades 102, one or more wires 110 may run from the solar cells 104 or an interconnected array of solar cells to the rotor system 113. In one embodiment, the solar cells 104 may be connected to the rotor system 113 by a single wire 110 or multiple wires 110. In one example, a first end of a wire 110 may be connected to the solar cells 104. The wire 110 may extend from the solar cells 104 into the spinner 106 via a hole or holes in the hub 108. In one embodiment, the hole(s) may be smoothed out to maintain an aerodynamic configuration of the wind turbine 100.

The wires 110 may include brushes to form a positive power connection (+ve) with the rotor system 113 and brushes to form a negative power connection (−ve) with the rotor system 113. The brushes of the wires 110 may be radially located at different locations of the rotor system 113 and along the same plane of the rotor system 113. In one embodiment, the brushes may maintain constant or continuous contact with the ring of the rotor system 113 to transfer the electrical power as the wires and brushes rotate.

The rotor system 113 may allow the blades 102 and the hub 108 to rotate about the first shaft 112 while maintaining an electrical connection with the solar cells 104. The first shaft 112 may be connected to a bearing 114 that holds the first shaft 112 in position relative to the body of the wind turbine 100 while allowing the first shaft 112 to rotate about an axis. A gearbox 116 may also be attached to the first shaft 112. The gearbox 116 may connect the first shaft 112 to a second shaft 120. The first shaft 112 may be a low-speed shaft and the second shaft 120 may be a high-speed shaft. In one embodiment, the first shaft 112 and the second shaft 120 may be separate shafts that connect at the gearbox 116. In another embodiment, the shaft may be a single shaft where the first shaft 112 may be a first sub-shaft (i.e. a first portion of the shaft) and the second shaft 120 may be a second sub-shaft (i.e. a second portion of the shaft). The gearbox 116 may convert a rotational speed of the first shaft 112 from a low speed (such as 30-60 rotations per minute) to a high speed (such as 1,000-1,800 rotations per minute) for the second shaft 120. In one embodiment, the rotational speed may be converted from the low speed to the high speed to produce a threshold rotational speed for a generator 118 to produce electricity. In another embodiment, the wind turbine 100 may include a direct-drive generator 118 that may operate at a low speed such that the first shaft 112 and the second shaft 120 are a single shaft that connects directly to the generator 118 without the gearbox 116. In another embodiment, the first shaft 112 may be extended or lengthened to accommodate the brushes and the ring.

The wind turbine 100 may include a nacelle 122 that may store a portion of the first shaft 112, the second shaft 120 the bearing 114, the gearbox 116, and the generator 118. The wind turbine 100 may also include a tower 124 to support the upper portion of the wind turbine 100, including the spinner 106, the nacelle 122, and other structures of the wind turbine 100. In one example, the tower 124 may be tubular steel, concrete, steel lattice, and so forth.

The wind turbine 100 may include wires 126 and wires 128 to conduct the power from the wind turbine 100 to another power source. In one example, the wires 126 may be an alternating current (AC) power line that may be connected to the generator 118. The wires 126 may conduct AC power from the generator 118 to the power source. In another example, the wires 128 may be a direct current (DC) power line that may be connected to the rotor system 113. The wires 128 may conduct DC power from the rotor system 113 to the power source. The power source may be a battery, a power grid, and so forth.

Figure 1B:
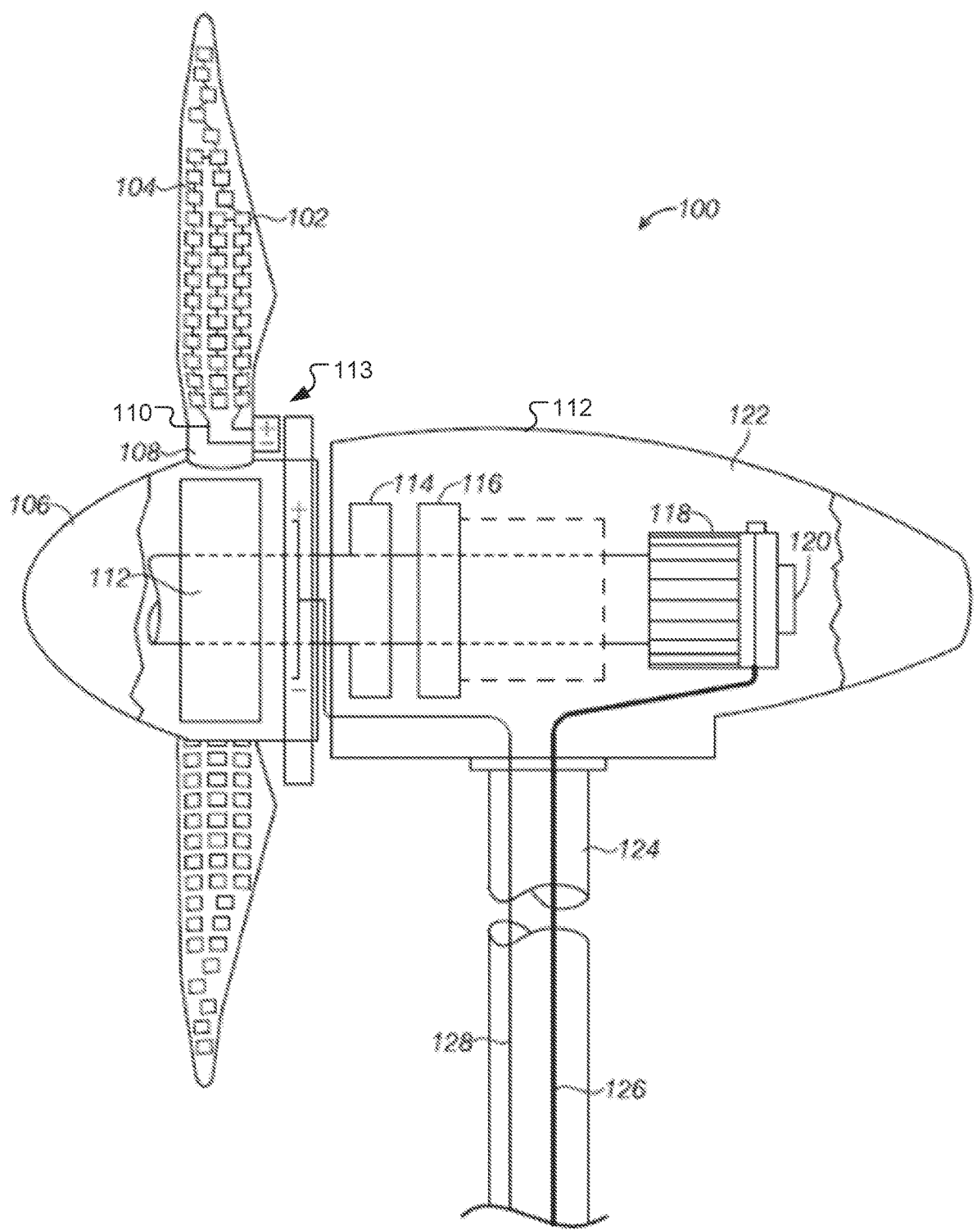
FIG. 1B illustrates a side exposed view of a wind turbine with an external rotor system, according to an embodiment.

FIG. 1B illustrates a side exposed view of a wind turbine with an external rotor system, according to an embodiment. Some of the features in FIG. 1B are the same or similar to some of the features in FIG. 1A as noted by same reference numbers, unless expressly described otherwise. In one embodiment as discussed above, the rotor system 113 may be located in a cavity of the spinner 106. In another embodiment, the rotor system 113 may attached to an external surface of the spinner 106 and/or the blades 102. For example, when the rotor system 113 includes a wireless power system or a slip ring system, as discussed below, a first portion of the rotor system 113 may be connected to one or more of the blades 102 and a second portion of the rotor system 113 may be connected to the eternal surface of the spinner 106.

Figure 2A:
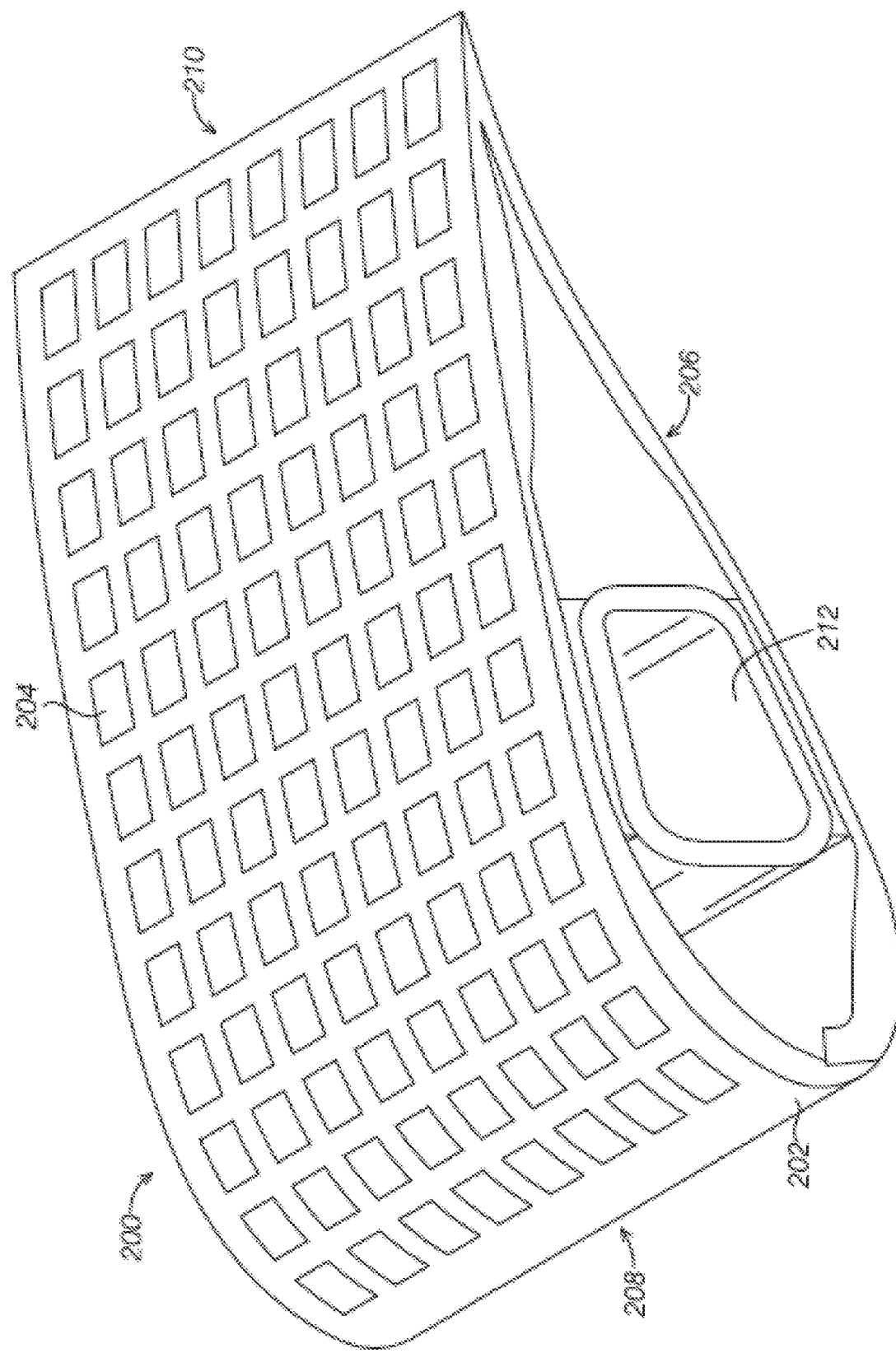
FIG. 2A illustrates a top perspective view of a blade of the wind turbine in FIG. 1, according to an embodiment.

FIG. 2A illustrates a top perspective view of a blade 200 of the wind turbine 100 in FIG. 1, according to an embodiment. As discussed above, the blade 200 may be connected to the hub 108 of the wind turbine 100 in FIG. 1. The blade 200 may be an airfoil. The airfoil may be a structure with curved surfaces shaped to catch the wind. In one embodiment, the blade 200 may include a top surface 202, solar cells 204, a bottom surface 206, a leading edge 208, a trailing edge 210, and an opening 212. In one example, the leading edge 208 may be rounded and the trailing edge may be taper to a sharp edge. In another example, the top surface 202 and the bottom surface 206 may be curved. In one embodiment, the curvature of the top surface 202 and the bottom surface 206 may be symmetric or substantially symmetric.

In one embodiment, the solar cells 204 may be attached to the top surface 202 and/or the bottom surface 206 by fasteners. The fasteners may be bolts, adhesives, hooks, rivets, and so forth. In another embodiment, the solar cells 204 may be integrated into the top surface 202 and/or the bottom surface 206. For example, the solar cells 204 may be solar cell film fixedly bonded to the exposed surfaces (including the top surface 202 and/or the bottom surface 206) of the blade 200. The location where the solar cells 204 are attached and/or are integrated into the blade 200 is not intended to be limiting. For example, the solar cells 204 may be attached or integrated into any surface of the blade 200 that is not a moving component of the blade 200.

In one embodiment, the solar cells 204 may be thin film modules that include solar cells. The thin film modules may be mounted to the blade 200 by: depositing one or more thin layers of orthin film (TF) of photovoltaic material on a substrate, such as glass, plastic or metal; creating crystalline-amorphous silicon{c-Si) cells and proto-crystalline silicon (pc~Si) on a glass substrate or superstrate and creating electrical connections by monolithic integration; and creating flexible thin-film cells and module depositing photoactive layers and/or other layers on a flexible substrate. In one example, the glass substrate or superstrate of solar cell 204 may have a threshold optical transparency level to allow the solar cells 204 to receive sunlight. In another example, the solar cells 204 may be assembled into modules by laminating the solar cells 204 onto a transparent colorless fluoropolymer on the first side of a substrate (typically ETFE or FEP) and laminating a polymer suitable for bonding to the blade 200 on a second side of the substrate.

In one embodiment, the blade 200 may include an opening 212 to connect the blade 200 to the hub 108 in FIG. 1. For example, the hub 108 may include an arm that extends from the hub 108 and is shaped to fit within the opening 212 to connect the blade 200 to the hub 108.

Figure 2B:
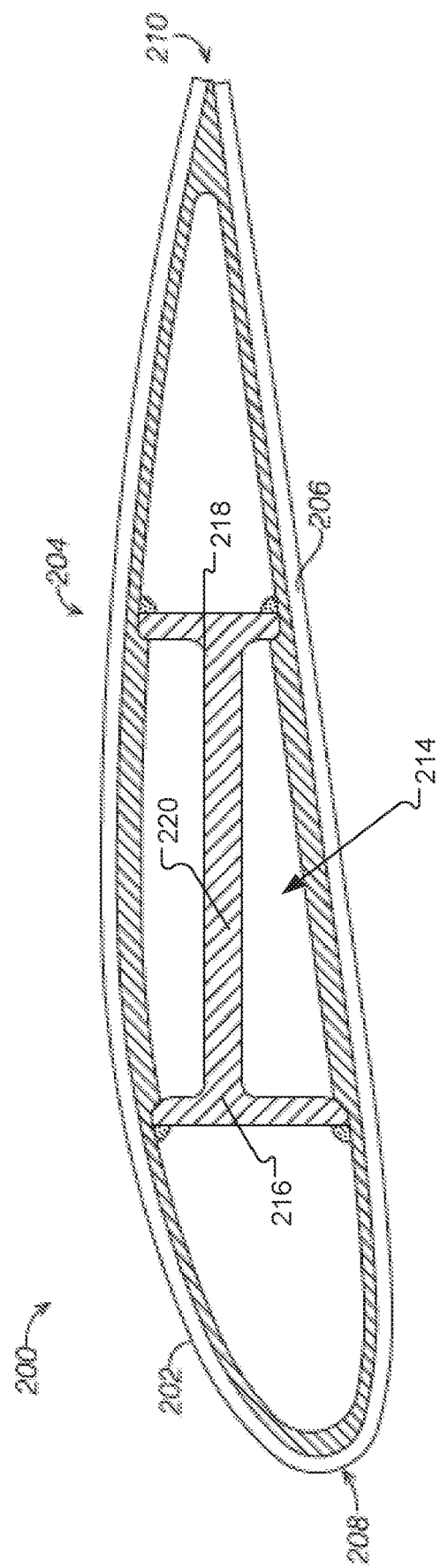
FIG. 2B illustrates a side exposed view of the blade in FIG. 2A, according to an embodiment.

FIG. 2B illustrates a side exposed view of the blade 200 in FIG. 2A, according to an embodiment. Some of the features in FIG. 2B are the same or similar to some of the features in FIG. 2A as noted by same reference numbers, unless expressly described otherwise. The blade 200 may include a support structure 214 located at an interior cavity of the blade 200. For example, the blade 200 may be hollow to reduce a weight of the blade 200. The support structure 214 may support the exterior body of the blade 200.

The support structure 214 may include a first arm 216 that extends from a bottom of the blade 200 to a top of the blade 200 at a first location. The support structure 214 may include a second arm 218 that extends from a bottom of the blade 200 to a top of the blade 200 at a second location. The support structure 214 may include a crossbar 220 that extends between the first arm 216 and the second arm 218.

Figure 2C:
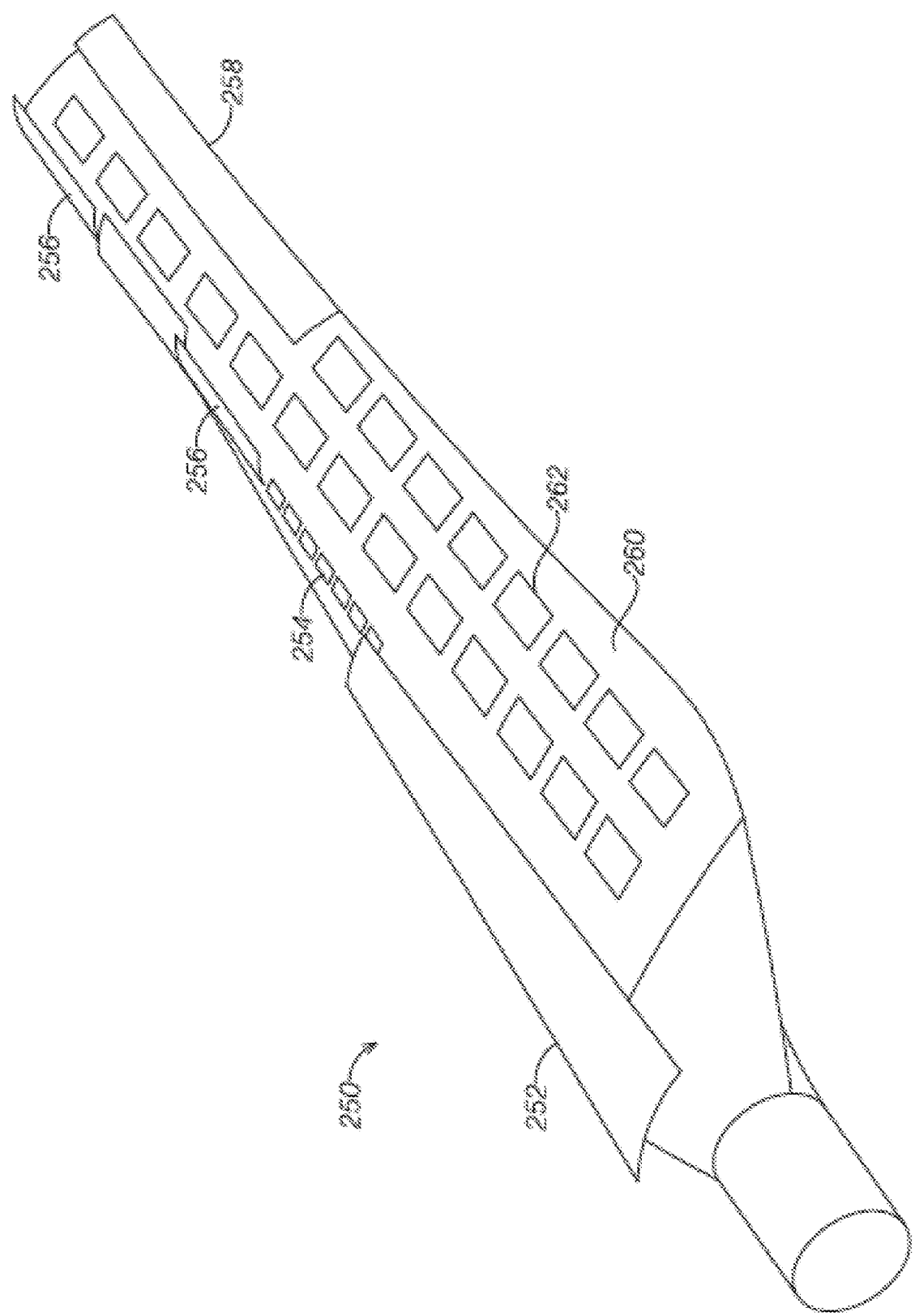
FIG. 2C illustrates a top perspective view of a blade, according to an embodiment.

FIG. 2C illustrates a top perspective view of a blade 250, according to an embodiment. The blade 250 may be an airfoil with a curved body. The blade 250 may include a leading edge flap 252, a vortex generator 254, spoilers 256, a trailing edge flap 258, an exterior surface of the blade 250, and solar cells 262. In one embodiment, the leading edge flap 252 may be a first flap attached to a front of the blade 250. The trailing edge flap 258 may be a second flap attached to a back of the blade 250. The leading edge flap 252 and the trailing edge flap 258 may be configured to reduce or eliminate a flow separation of wind and increases blade performance. The vortex generators 254 may be one or more small fins (relative to the size of the blade 250) that are configured to also reduce the flow separation of the wind and improve a lift of the blade 250. The spoilers 256 may be flaps attached to the front and/or the back of the blade 250. In one embodiment, the spoilers 256 may extend upward or downward, relative to a top or bottom surface of the blade 250, to create drag and reduce a speed of the blade 250. In another embodiment, the spoilers 256 may separate an air flow from a surface of the blade 250 when in an elevated position to minimize the drag of the blade 250, which increases a power of the blade 250.

In one embodiment, the solar cells 262 may be attached to the exterior surface 260 of the blade 250 by fasteners. The fasteners may be bolts, adhesives, hooks, rivets, and so forth. In another embodiment, the solar cells 262 may be integrated into the exterior surface 260 of the blade 250. For example, the solar cells 262 may be solar cell film fixedly bonded to the exterior surface 260 of the blade 200. The location where the solar cells 262 attach and/or are integrated into the blade 250 is not intended to be limiting. For example, the solar cells 262 may be attached or integrated into any surface of the blade 250 that is not a moving component of the blade 250.

The designs, shapes, and/or configurations of the blades 200 and 250 in FIGS. 2A-2C are not intended to be limiting. For example, the designs, shapes, and/or configurations of the blades of the wind turbine 100 in FIG. 1A may vary based on the aerodynamics and mechanical forming of the wind turbine 100. The blades 200 and 250 are exemplary blades that may be attached to the wind turbine 100.

Figure 3A:
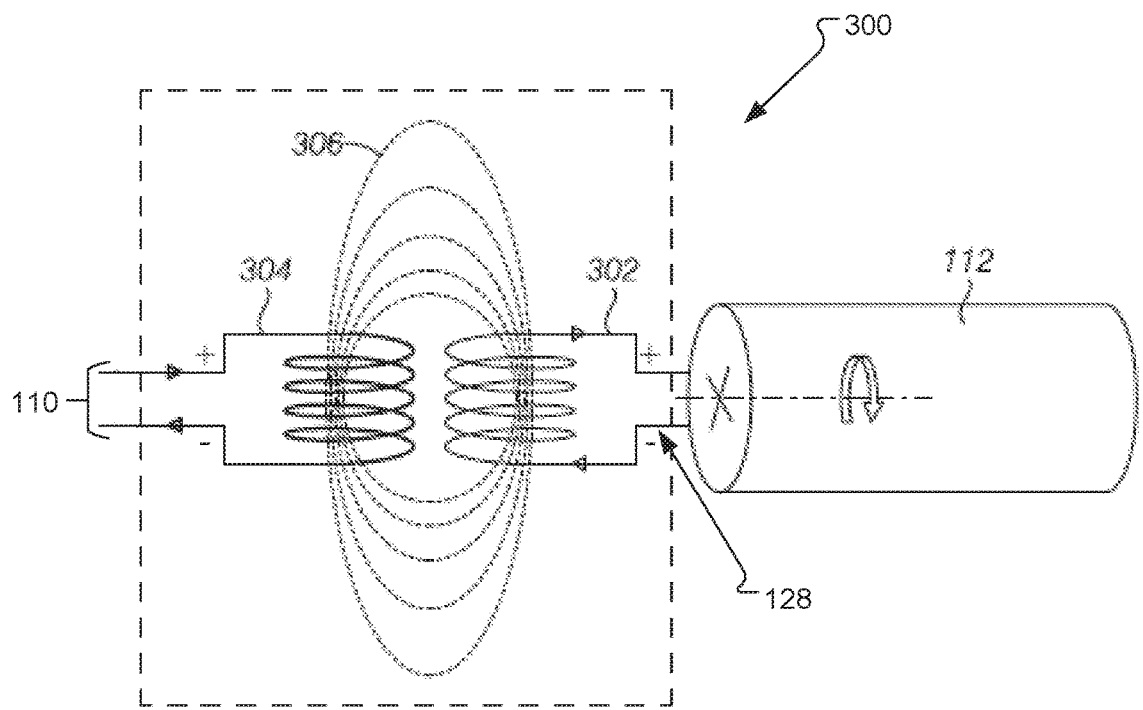
FIG. 3A illustrates a rotor system configured to attach to the first shaft in FIG. 1, according to an embodiment

FIG. 3A illustrates a rotor system 300 configured to attach to the first shaft 112 in FIG. 1, according to an embodiment. In one embodiment, the rotor system 300 may be the rotor system 113 as shown in FIG. 1. The rotor system 300 may include the first shaft 112, a first induction coil 302, and a second induction coil 304. The rotor system 300 may be an induction system to transfer power between the first induction coil 302 and the second induction coil 304 without making any physical contact between the first induction coil 302 and the second induction coil 304. Inductive charging (also referred to as wireless charging or cordless charging) uses an electromagnetic field 306 to transfer energy between the first induction coil 302 and the second induction coil 304.

In one embodiment, the second induction coil 304 may be electrically connected to the solar cells 104 by the wires 110. As the solar cells 104 receive the energy from the sun, the solar cells 104 may transfer the energy to the second induction coil 304 via the wires 110. When the second induction coil 304 receives the energy, the second induction coil 304 may induce the electromagnetic field 306. The electromagnetic field 306 may induce a current at the first induction coil 302. The current may then be transferred to a power source via the wires 128, as discussed above. As discussed above, the blades 102 may cause the spinner 106, the hub 108, and/or the first shaft 112 in FIG. 1 to rotate. The contactless transfer of the power between the first induction coil 302 and the second induction coil 304 may allow the power to be transferred from the solar cells 104 in FIG. 1 without the wires 110 and/or 128 to become entangled, wristed, or broken as the blades 102, the spinner 106, the hub 108, and/or the first shaft 112 as they rotate while the remaining portion of the wind turbine 100 remains fixed and stationary.

Figure 3B:
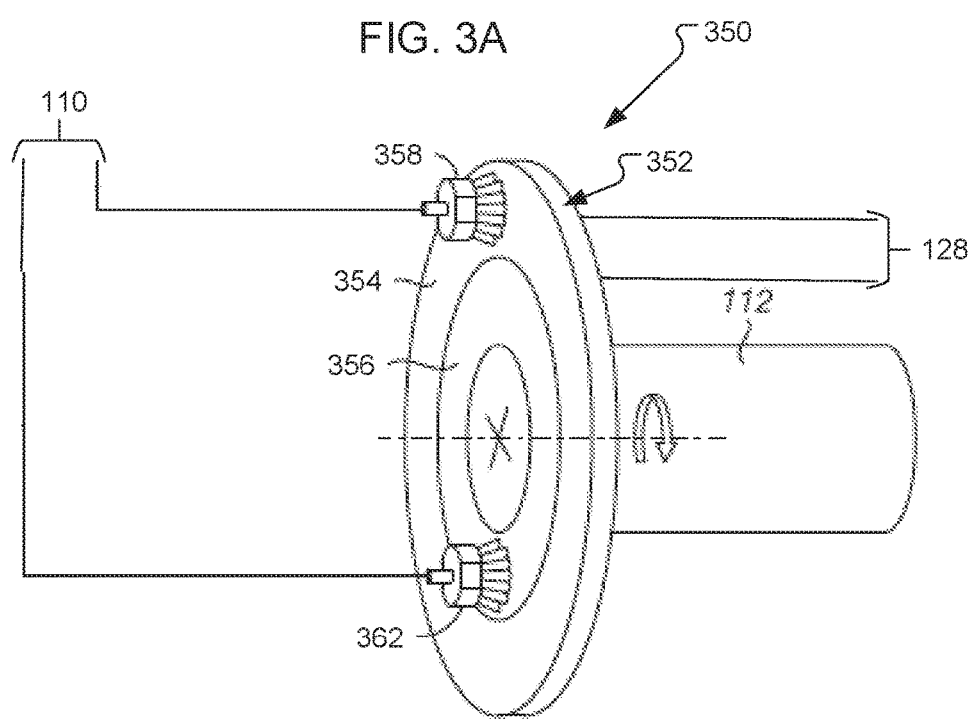
FIG. 3B illustrates a rotor system configured to attach to the first shaft in FIG. 1, according to an embodiment.

FIG. 3B illustrates a rotor system 350 configured to attach to the first shaft 112 in FIG. 1, according to an embodiment. In one embodiment, the rotor system 350 may be the rotor system 113 as shown in FIG. 1. The rotor system 350 may include the first shaft 112, a ring 352, a first brush 358, and a second brush 362. The ring 352 may be connected to the first shaft 112. The ring 352 may include a first contact ring 354 and a second contact ring 356. The first contact ring 354 may correspond with a location of the first brush 358 such that the first brush 358 may contact a portion of the first contact ring 354. The second contact ring 356 may correspond with a location of the second brush 362, such that the second brush 362 may contact a portion of the second contact ring 356. In one embodiment, the first brush 358, the second brush 362, the first contact ring 354, and/or the second contact ring 356 may include one or more materials that conduct electricity. The materials may include metals (such as copper), electrolytes, superconductors, semiconductors, plasmas, nonmetallic conductors (such as graphite), conductive polymers, and so forth.

The first brush 358 and the second brush 362 may be connected to the solar cells 104 of the wind turbine 100 by the wires 110 in FIG. 1. In one example, the wires 110 may include a first wire that conducts a positive current and connects to the first brush 358. In another example, the wires 110 may include a second wire that conducts a negative current and connects to the second brush 362. As the blades 102, the spinner 106, the hub 108, and/or the first shaft 112 rotate, the first brush 358 may rotate about the first contact ring 354 and the second brush 362 may rotate about the second contact ring 356 as the ring 352 remains fixed and stationary. The currents may be transferred from the first brush 358 and the second brush 362 to the wires 128 via the first contact ring 354 and the second contact ring 356. The current may be transferred along the wires 128 to the power source, as discussed above.

As discussed above, the blades 102 may cause the spinner 106, the hub 108, and/or the first shaft 112 in FIG. 1 to rotate. The rotor system 350 to transfer the power between the first brush 358 and the first contact ring 354 and the second brush 362 and the second contact ring 356 may allow the power to be transferred from the solar cells 104 in FIG. 1 without the wires 110 and/or the wires 128 becoming entangled, wristed, or broken as the blades 102, the spinner 106, the hub 108, and/or the first shaft 112 rotate while the remaining portion of the wind turbine 100 remains fixed and stationary. In one embodiment, the ring 352 is insulated from the first shaft 112.

The number of induction coils, brushes, and/or contact rings in the rotor systems 300 and 350 in FIGS. 3A and 3B are not intended to be limiting. In one example, the wind turbine 100 in FIG. 1 may include the rotor system 300 and the rotor system 350. In another example, the number of induction coils the rotor system 300 may include and/or the number of brushes and contact rings the rotor system 350 may include may vary based on the amount of energy the solar cells 104 of FIG. 1 may generate. In this example, as the amount of energy the solar cells 104 generate increases, the number of induction coils the rotor system 300 may include and/or the number of brushes and contact rings the rotor system 350 may increase.

The disclosure above encompasses multiple distinct embodiments with independent utility. While these embodiments have been disclosed in a particular form, the specific embodiments disclosed and illustrated above are not to be considered in a limiting sense as numerous variations are possible. The subject matter of the embodiments includes the novel and non-obvious combinations and sub-combinations of the various elements, features, functions and/or properties disclosed above and inherent to those skilled in the art pertaining to such embodiments. Where the disclosure or subsequently filed claims recite "a" element, "a first" element, or any such equivalent term, the disclosure or claims is to be understood to incorporate one or more such elements, neither requiring nor excluding two or more such elements.

Applicant(s) reserves the right to submit claims directed to combinations and sub-combinations of the disclosed embodiments that are believed to be novel and non-obvious. Embodiments embodied in other combinations and sub-combinations of features, functions, elements and/or properties may be claimed through amendment of those claims or presentation of new claims in the present application or in a related application. Such amended or new claims, whether they are directed to the same embodiment or a different embodiment and whether they are different, broader, narrower or equal in scope to the original claims, are to be considered within the subject matter of the embodiments described herein.

The invention claimed is:

1. A system, comprising:
   a housing of a wind turbine;
   a first blade extending from the housing of the wind turbine, the first blade configured to catch wind from a surrounding area to rotate the first blade about a first axis and convert kinetic energy into rotational energy;
   a first solar cell connected to an exterior surface of the first blade, the first solar cell configured to convert solar energy into first energy;
   a hub connected to an end of the first blade, the hub being located at an interior cavity of the housing;
   a shaft connected to the hub, the shaft comprising the first axis and configured to rotate about the first axis as the first blade converts the kinetic energy into the rotational energy;
   a rotor system comprising:
     a stationary portion comprising a second axis coaxial with the first axis of the shaft, wherein the shaft passes through the stationary portion, the stationary portion configured to remain stationary relative to the first blade as the first blade rotates, and a rotating portion electrically connected to the first solar cell to receive the first energy from the first solar cell, the rotating portion proximate the stationary portion and configured to rotate about the first axis as the first blade rotates, wherein the rotor system is configured to allow transmission of the first energy through the rotating portion and the stationary portion to a power source as the first blade rotates; and a generator connected to the shaft, the generator configured to convert the rotational energy to second energy, wherein the generator is configured to send the second energy to the power source as the first blade rotates.

2. The system of claim 1, wherein the rotor system is a slip ring wherein:

the stationary portion is a ring attached to an interior portion of the housing, the ring including a contact ring configured to conduct electricity, wherein the ring is configured to remain stationary relative to the first blade as the blade rotates; and the rotating portion is:

a wire connected to the first solar cell, the wire extending from the first solar cell and through the hub to an area approximate the ring; and a brush comprising:

a first end connected an end of the wire; and a second end comprising a bristle, wherein when the bristle contacts the contact ring, the bristle is to form an electrical connection to conduct the first energy from the first solar cell to the contact ring.

3. The system of claim 2, wherein the brush remains in contact with the contact ring to conduct the first energy to the contact ring as the first blade, the hub, and the shaft rotate about the first axis.

4. The system of claim 1, wherein the rotor system is a contactless rotor system comprising:

a first induction coil electrically connected to the first solar cell, the first induction coil being attached to the hub; and a second induction coil attached to the interior cavity of the housing, the second induction coil configured to contactlessly receive the first energy from the first induction coil, wherein the second induction is configured to send the first energy to the power source.

5. The system of claim 4, wherein:

the first induction coil rotates about the first axis as the first blade, the hub, and the shaft rotate about the first axis, and the second induction coil remains stationary relative to the first induction coil as the first induction coil rotates about the first axis, wherein the second induction coil is configured to contactlessly receive the first energy from the first induction coil as the first induction coil rotates about the first axis.

6. The system of claim 1, wherein the first solar cell is a film attached to the exterior surface of the first blade.

7. The system of claim 6, wherein:

the film is bonded to the exterior surface of the first blade; or the film is attached to the exterior surface of the first blade by a fastener.

8. The system of claim 1, wherein the first solar cell is integrated into the exterior surface of the first blade.

9. The system of claim 8, wherein the first solar cell is covered by a protective material, wherein the protective material is a transparent material or a translucent material that allows solar energy to pass through the protective material to reach the first solar cell while protecting the first solar cell.

10. The system of claim 1, further comprising:

a first wire connecting the rotor system to the power source, the first wire being configured to conduct the first energy from the rotor system to the power source; and a second wire connecting the generator to the power source, the second wire being configured to conduct the second energy from the generator to the power source.

11. The system of claim 1, further comprising:

a second blade extending from the housing of the wind turbine, the second blade configured to catch wind from the surrounding area to rotate the first blade and convert kinetic energy into rotational energy, wherein an end of the second blade is connected to the hub; and a second solar cell connected to an exterior surface of the second blade, the second solar cell configured to convert solar energy into the first energy.

12. The system of claim 1, further comprising a gearbox connected to the shaft, wherein the shaft comprises a first sub-shaft connected between the hub and the gearbox and a second sub-shaft connected between the gearbox and the generator, wherein:

the first sub-shaft has a first diameter and is configured to rotate at a first rotational speed;

the second sub-shaft has a second diameter and is configured to rotate at a second rotational speed; and the gearbox is configured to convert the first rotational speed to the second rotational speed.

13. An apparatus, comprising:

a blade of a wind turbine, the blade configured to catch wind from a surrounding area to rotate the blade about a first axis and convert kinetic energy into rotational energy;

a solar cell connected to an exterior surface of the blade, the solar cell configured to convert solar energy into electric energy; and a slip ring comprising:

a contact ring comprising a second axis coaxial with the first axis, the contact ring configured to remain stationary relative to the blade as the blade rotates about the first axis; and a wire configured to rotate around the first axis while the blade rotates about the first axis, the wire comprising:

a first end connected to the first solar cell to receive the first electric energy from the first solar cell; and a second end connected to an electrically conductive brush to form an electrical contact with the contact ring, wherein the electrically conductive brush is to conduct the energy from the first solar cell to the contact ring while the wire and the electrically conductive brush rotate about the first axis, and wherein slip ring is configured to transmit the electrical energy to a power source while the blade rotates about the first axis.

14. The apparatus of claim 13, wherein the solar cell is a substrate bonded to the exterior surface of the blade.

15. The apparatus of claim 13, further comprising:

a first wire connected to the solar cell and configured to receive a positive current from the solar cell; and a second wire connected to the solar cell and configured to receive a negative current from the solar cell, wherein the first wire and the second wire are configured to rotate about the first axis with the blade while maintaining an electrical connection with the contact ring.

16. The apparatus of claim 13, further comprising:

a shaft coupled to the blade, wherein as the blade rotates the shaft about the first axis; and a gearbox connected to the shaft, wherein the gearbox converts a first rotational speed of a first portion of the shaft to a second rotational speed for a second portion of the shaft.

17. A device, comprising:

a blade extending from a housing of a wind turbine, the blade configured to catch wind from a surrounding area to rotate the blade about a first axis and convert kinetic energy into rotational energy;

a solar cell connected to an exterior surface of the blade, the solar cell configured to convert solar energy into first energy;

a shaft coupled to the blade, the shaft comprising the first axis and configured to rotate about the first axis as the blade converts the kinetic energy into the rotational energy;

a contactless rotor system comprising:

a stationary induction coil comprising a second axis coaxial with the first axis and configured to remain stationary relative to the blade as the blade rotates, and a rotating induction coil electrically connected to the solar cell and configured to rotate about the first axis as the first blade rotates, wherein the contactless rotor system is configured to contactlessly allow transmission of the first energy through the rotating induction coil and the stationary induction coil to a power source as the blade rotates; and a generator connected to the shaft, the generator configured to convert the rotational energy to second electric energy, wherein the generator is configured to send the second electric energy to the power source.

18. The device of claim 17, where the rotating induction coil is electrically connected to the solar cell while the stationary induction coil remains stationary as the blade rotates.

19. The device of claim 17, wherein the solar cell is integrated into a surface of the blade or the solar cell is attached to the surface of the blade.

20. The device of claim 17, wherein the solar cell is covered by a protective material to protect at least one of the blade or the solar cell while allowing light to be transmitted through the protective material to the solar cell.

* * * * *